(12) United States Patent
Deboy et al.

(10) Patent No.: US 6,577,509 B2
(45) Date of Patent: Jun. 10, 2003

(54) SEMICONDUCTOR CIRCUIT AND SWITCH-MODE POWER SUPPLY

(75) Inventors: Gerald Deboy, München (DE); Gerald Mündel, Ebersberg (DE); Harald Zöllinger, Gilching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/079,720

(22) Filed: Feb. 21, 2002

(65) Prior Publication Data

US 2002/0159276 A1 Oct. 31, 2002

(30) Foreign Application Priority Data

Feb. 21, 2001 (DE) .......................................... 101 08 131

(51) Int. Cl.[7] .............................................. H02M 3/335
(52) U.S. Cl. ...................... 363/20; 363/97; 363/12.12
(58) Field of Search ................. 363/20, 21.01, 363/21.04, 21.12, 21.13, 21.15, 21.18, 95, 97

(56) References Cited

U.S. PATENT DOCUMENTS

| | | | |
|---|---|---|---|
| 4,942,509 A | * | 7/1990 | Shires et al. ................... 363/89 |
| 5,014,178 A | | 5/1991 | Balakrishnan |
| 5,627,733 A | * | 5/1997 | Bressler ..................... 363/21.09 |
| 5,963,024 A | * | 10/1999 | Doemen ...................... 323/282 |
| 6,125,046 A | | 9/2000 | Jang et al. |
| 6,208,532 B1 | * | 3/2001 | Preller ..................... 363/21.16 |
| 6,314,003 B2 | * | 11/2001 | Preller ..................... 363/21.04 |

FOREIGN PATENT DOCUMENTS

EP 0 585 788 B1 8/1995

* cited by examiner

Primary Examiner—Adolf Denske Berhane
(74) Attorney, Agent, or Firm—Laurence A. Greenberg; Werner H. Stemer; Ralph E. Locher

(57) ABSTRACT

The invention relates to a semiconductor circuit having a drive circuit, a load that is disposed between a supply voltage, and a controllable, clocked semiconductor switching element for clocked switching of the load. The invention furthermore relates to a switch-mode power supply having such a semiconductor circuit.

27 Claims, 9 Drawing Sheets

SEMICONDUCTOR CIRCUIT AND SWITCH-MODE POWER SUPPLY

BACKGROUND OF THE INVENTION

Field of the Invention

The invention relates to a semiconductor circuit having a drive circuit, having a load that is disposed between a supply voltage, and having a controllable semiconductor switching element for switching the load. The invention furthermore relates to a switch-mode power supply having such a semiconductor circuit.

The expression controllable semiconductor switching element should be regarded as meaning a controllable (load-break) switch that, in addition to its actual functionality—namely the switching of currents and voltages, has additional functionalities, such as temperature protection and freewheeling protection. A controllable semiconductor switching element may contain, for example, a power transistor—for example a MOSFET—or an IGBT.

Controllable semiconductor switching elements have a load circuit and a control connection for driving the semiconductor switching element. To control these semiconductor switching elements, an additional supply voltage is generally required in addition to a supply voltage for the load circuit, with the control signal being derived from the additional supply voltage. Such a requirement applies, in particular, to those circuit applications in which a load voltage that is very much higher than the control voltage used. Circuit applications such as these, for example, switch-mode power supplies, power supplies, switch-mode regulators, and the like, are frequently operated directly from the mains voltage.

A switch-mode power supply is a regulated power supply unit that does not require any mains transformer at all. In a switch-mode power supply, the mains voltage is rectified directly, and is smoothed in an energy storage capacitor, so that a high DC voltage is available. A controllable switch "chops" the DC voltage so that a periodic square-wave pulse sequence is produced, which is transformed in a transformer in accordance with the desired transformation ratio of the transformer windings, and is then rectified and filtered once again. The configuration and method of operation of such a switch-mode power supply are described, for example, in CoolSET, TDA 16822, "Off-Line current mode controller with CoolMOS on board", Datasheet, Version 1.0, April 2000, from Infineon Technologies AG, in particular, on page 4 of that document.

In switch-mode power supplies, the supply voltage for the drive circuit that drives the load-break switch can be produced, for example, by an additional primary transformer winding. The supply potential that is obtained from the additional primary transformer winding is then fed directly to the drive circuit. However, when not switched on, no supply potential can be tapped off on the additional primary transformer winding. Thus, when switching on a switch-mode power supply, it is necessary to ensure that the drive circuit is supplied with power immediately, in order to make it possible to drive the load-break switch appropriately. A starting circuit is used for such a purpose, which produces a starting charging current that is derived from the load voltage and initially builds up the supply voltage on a buffer capacitor. The energy for the first switching processes of the load-break switch is then drawn from the buffer capacitor until the supply voltage for the drive circuit of the switching-mode power supply is produced across the additional primary transformer winding.

Either a so-called start-up resistor or a current source in the form of a depletion MOSFET is typically used for the starting circuit. However, such a discrete configuration of a starting circuit is not a particularly cost-effective solution, particularly due to the additional space required for the starting circuit and the additional components.

Furthermore, the starting circuit produces undesirable power losses during operation of the switch-mode power supply in the situation where the starting current cannot be switched off after starting.

In addition to the discrete version of a starting circuit just described, an integrated solution also exists, using comparatively complex high-voltage technologies. In such an integrated version, the starting circuit, the drive circuit, and the load-break switch are formed monolithically on a single chip. One such circuit configuration is described, for example, in European Patent Application 0 585 788 B1, corresponding to U.S. Pat. No. 5,285,369 to Balakrishnan. The company Power Integrations markets the corresponding semiconductor circuits under the designations TOPSwitch and TinySwitch. However, because the drive circuit and the load-break switch are integrated monolithically, they cannot be optimized independently of one another, and such inability to optimize frequently leads to overdesign of the individual circuit elements and, hence, typically, to the load-break switch requiring a large area related to its switched-on resistance.

Furthermore, in many switch-mode power supplies and clocked power supplies, it is necessary to know the load current flowing through the load-break switch and its waveform precisely. For example, in quasi-resonant switch-mode power supplies, which are in the form of flyback converters, the time at which the load current is switched on, and, hence, the time at which the current through the primary winding of the transformer is switched on, is derived from the zero crossing of the load current in the secondary winding of the transformer. The derivation is done in a conventional manner by detecting the zero crossing of the drain-source voltage, from which the supply voltage for the drive circuit is obtained. In addition to the complexity for the additional transformer winding required for such a purpose, the drive circuit requires a corresponding additional detector input for an external additional circuit, which carries out the evaluation of the zero crossing. A quasi-resonant switch-mode power supply according to the prior art is marketed, for example, with the product designation TDA 4605 by the company Infineon Technologies AG, located in Munich, Germany.

A further requirement occurs, in particular, in safety-relevant applications of such semiconductor switching elements. In applications such as these, the voltage applied across the load-break switch must be evaluated. When the load-break switch is switched off, the load circuit voltage and any overvoltage across the load-break switch, or else any discrepancy in the load circuit voltage that is caused, for example, by oscillation or load chopping, can be derived therefrom. When the load-break switch is switched on, it can be checked for correct operation by evaluation of the voltage that is present across the load-break switch. Until now, an external or else integrated circuit that was produced specifically for such a check and that supplies the corresponding status information relating to the load circuit voltage, has been provided to determine the voltage that is present across the load-break switch. Until now, the load-break switch has not itself been configured to supply status information relating to the load current or to the voltage that is dropped across the load path of such a switch.

The provision of a starting circuit, which is intended specifically for starting a generic type of such a semiconductor circuit, of an additional circuit that is intended specifically for detecting the zero crossing of the load current, and of an evaluation circuit that is intended specifically for evaluating the load circuit voltage that is dropped across the load-break switch, is, furthermore complex and, hence, makes the overall circuit configuration very expensive.

SUMMARY OF THE INVENTION

It is accordingly an object of the invention to provide a semiconductor circuit and a switch-mode power supply having such a semiconductor circuit that overcomes the hereinafore mentioned disadvantages of the heretofore-known devices of this general type and that at least partially satisfies the above requirements and that furthermore can be produced very much more easily in terms of its circuitry.

With the foregoing and other objects in view, there is provided, in accordance with the invention, a semiconductor circuit including a drive circuit having a drive circuit output and producing a control signal at the drive circuit output, a controllable, integrated semiconductor switching element configured to switch itself on and off, a load-break switch for clocked switching of a load, the load-break switch having first and second load path connections, a control connection connected to the drive circuit output, and the control signal controlling the load-break switch through the control connection, a first current source having a first output and providing a starting charging current at the first output when the load-break switch is switched off, the first current source connected to the first load path connection, a monitoring device having at least one second current source with a second output, the second current source producing a status signal at the second output, the monitoring device measuring a voltage between the first and second load path connections and/or measuring a potential present at one of the first and second load path connections, the monitoring device producing the status signal dependent upon the voltage and/or the potential, and a starting charging device connected to the drive circuit and supplying the drive circuit with power through the starting charging current.

The semiconductor circuit according to the invention has a controllable, preferably clocked, semiconductor switching element with a load-break switch and a drive circuit that drives the load-break switch. In addition to standard connections for controlling the load-break switch (gate) and two load connections (drain, source), the semiconductor switching element also has further connections that, to a certain extent, upgrade the semiconductor switching element to an "intelligent" semiconductor switch, which provides a number of additional functions for operation of the semiconductor circuit. These additional connections include a connection for the starting of the semiconductor circuit, a connection for controlling the starting process, and a connection for providing status information, for example, about the load current and the load circuit voltage. The semiconductor switching element is upgraded, according to the invention, by an appropriate circuit to form a clocked semiconductor switch, which switches itself on and off.

The semiconductor switching element according to the invention also has a starting device and/or a monitoring device in addition to its conventional functionality. The drive circuit, and, hence, also the semiconductor switching element, can be switched on through the starting device, while they can be switched off, or can be kept in a switched-on state, through the monitoring device. Depending on the configuration, the monitoring device is used for short-circuit identification and/or to provide a facility for switching on or off in the event of an overvoltage. Such use allows the load circuit and the supply circuit to be optimally decoupled, that is to say, the circuit with the high voltage and the circuit with the low voltage.

The functionalities contained in the semiconductor switching element according to the invention can now be configured such that they can be used for the semiconductor circuit to switch itself on, for clocked control of the supply voltage for the drive circuit, to prevent the drive circuit from switching itself on, to switch the drive circuit and/or the load-break switch off in the event of defects, and for evaluation of the voltage that is dropped across the load-break switch and the control signals that are derived from such a voltage.

In accordance with another feature of the invention, the starting charging device includes the first current source and an energy storage capacitor charged by the starting charging current and, in a charged state of the capacitor, the capacitor supplying the drive circuit with a supply potential.

In accordance with a further feature of the invention, there is provided a decoupling diode disposed in series between the first current source and the energy storage capacitor and a voltage limiter disposed in parallel with the energy storage capacitor.

In accordance with an added feature of the invention, the first current source is a controllable current source.

In accordance with an additional feature of the invention, the controllable current source is a controllable semiconductor switch.

In accordance with yet another feature of the invention, the starting charging device has a switching-off device for switching off the starting charging device, the first current source has a control connection, the switching-off device has an input connected to a floating potential and an output connected to the control connection of the first current source, and the switching-off device switches, preferably, always switches, the starting charging device to a switched-off state whenever a potential at the input corresponds to a potential at the first output and/or a potential at the second load path connection.

In accordance with yet a further feature of the invention, there is provided a controllable switch and/or a limiter circuit disposed between the first output and the input of the switching-off device.

In accordance with yet an added feature of the invention, there is provided a zener diode, a limiter switch, and/or an integrated circuit disposed between the first output and the input of the switching-off device, at least one having a rising reverse current as temperatures rises and/or a reducing internal resistance as temperatures rises.

In accordance with yet an additional feature of the invention, the starting charging device has a detector device and a further output, the detector device produces a status signal at the further output at a zero crossing of a voltage dropped across the load-break switch and/or a potential present at one of the first and second load path connections, and the status signal switches the load-break switch to a switched-on state at each zero crossing.

In accordance with again another feature of the invention, the monitoring device has an overvoltage switch-on facility identifying when overvoltages are present across the load-break switch and switching on the load-break switch when an overvoltage occurs.

In accordance with again a further feature of the invention, there is provided an AND gate connected upstream of the control connection of the load-break switch with respect to a control signal flow direction, the monitoring device producing a switch-on signal in response to switching on in an event of an overvoltage, the switch-on signal being fed to the AND gate, and the AND gate switching on the load-break switch.

In accordance with again an added feature of the invention, the monitoring device has an undervoltage switch-off facility identifying undervoltages present across the load-break switch and, in an event of an undervoltage, switching off the load-break switch and/or not switching the load-break switch on.

In accordance with again an additional feature of the invention, the monitoring device has a hold circuit when switching off occurs in response to an undervoltage, the hold circuit has an inverter disposed between the second output and the control connection of the load-break switch, and an AND gate is connected downstream from the inverter and switches off the load-break switch for as long as the undervoltage is present.

In accordance with still another feature of the invention, there is provided a clocked drive signal controlling the semiconductor switching element.

In accordance with still a further feature of the invention, the load-break switch is a power semiconductor component, in particular, based on the compensation principle.

In accordance with still an added feature of the invention, the load-break switch is a power MOSFET and/or an IGBT.

In accordance with still an additional feature of the invention, the semiconductor switching element is in cell form and includes a plurality of cells having load paths, the load paths of a majority of the cells are connected in parallel and form the load-break switch, the starting charging device and/or the monitoring device have transistors, and a remainder of the cells form the transistors.

In accordance with another feature of the invention, the semiconductor switching element has a current measurement device having at least one cell of the power semiconductor component and measures the status signal through the load-break switch in accordance with a ratio of measurement cells to main cells.

In accordance with a further feature of the invention, the drive circuit has an oscillator having an output side, a logic circuit having an output side, and a driver circuit having driver circuit inputs, a supply potential is supplied to each of the oscillator, the logic circuit, and the driver circuit, the output side of the oscillator and the output side of the logic circuit are connected to a respective one of the driver circuit inputs, the driver circuit is connected to the control connection of the load-break switch, and the driver circuit is driven based upon a control signal, an oscillator signal, and/or a signal derived from the status signal.

With the objects of the invention in view, there is also provided a switch-mode power supply including a load, a semiconductor circuit having a drive circuit having a control signal input and a drive circuit output and producing a control signal at the drive circuit output, a controllable, integrated semiconductor switching element configured to switch itself on and off, a load-break switch for clocked switching of the load, the load-break switch having first and second load path connections, a control connection connected to the drive circuit output, and the control signal controlling the load-break switch through the control connection, a first current source having a first output and providing a starting charging current at the first output when the load-break switch is switched off, the first current source connected to the first load path connection, a monitoring device having at least one second current source with a second output, the at least one second current source producing a status signal at the second output, the monitoring device measuring a voltage between the first and second load path connections and/or measuring a potential present at one of the first and second load path connections, the monitoring device producing the status signal dependent upon the voltage and/or the potential, and a starting charging device connected to the drive circuit and supplying the drive circuit with power through the starting charging current, a transformer having a primary winding and a secondary winding with a secondary output, the semiconductor switching element configured to apply a substantially rectified voltage in a clocked manner to the primary winding, the secondary winding supplying power from the primary winding at the secondary output to the load, a feedback device connected to the control signal input, and the feedback device supplying one of a voltage produced at the secondary output and a current at the secondary output to the control signal input.

In accordance with an added feature of the invention, the drive circuit and parts of the starting charging device not contained in the semiconductor switching element are integrated together on a single semiconductor chip.

In accordance with yet a further feature of the invention, the semiconductor switching element is integrated on a first semiconductor chip, the drive circuit is integrated on a second semiconductor chip, and the first and second semiconductor chips are embedded together in a single housing for a semiconductor component.

In accordance with an additional feature of the invention, the switch-mode power supply is a flyback converter.

In accordance with yet another feature of the invention, the switch-mode power supply is a forward converter.

In accordance with a concomitant feature of the invention, the switch-mode power supply is a quasi-resonant switch-mode power supply.

In complete contrast to circuit configurations according to the prior art, in which at least some of these functionalities are carried out by a circuit configuration that is provided specifically for such a purpose, that must be connected to the semiconductor switching element form the outside, and that is, thus, very complex and expensive, the semiconductor circuit according to the invention can be provided by integration of all the prior art functionalities by a single semiconductor switching element and a drive circuit that is specifically intended and optimized for such a purpose.

Other features that are considered as characteristic for the invention are set forth in the appended claims.

Although the invention is illustrated and described herein as embodied in a semiconductor circuit and a switch-mode power supply, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

In the figures of the drawings, unless stated otherwise, identical reference symbols denote identical parts.

Figure 1:
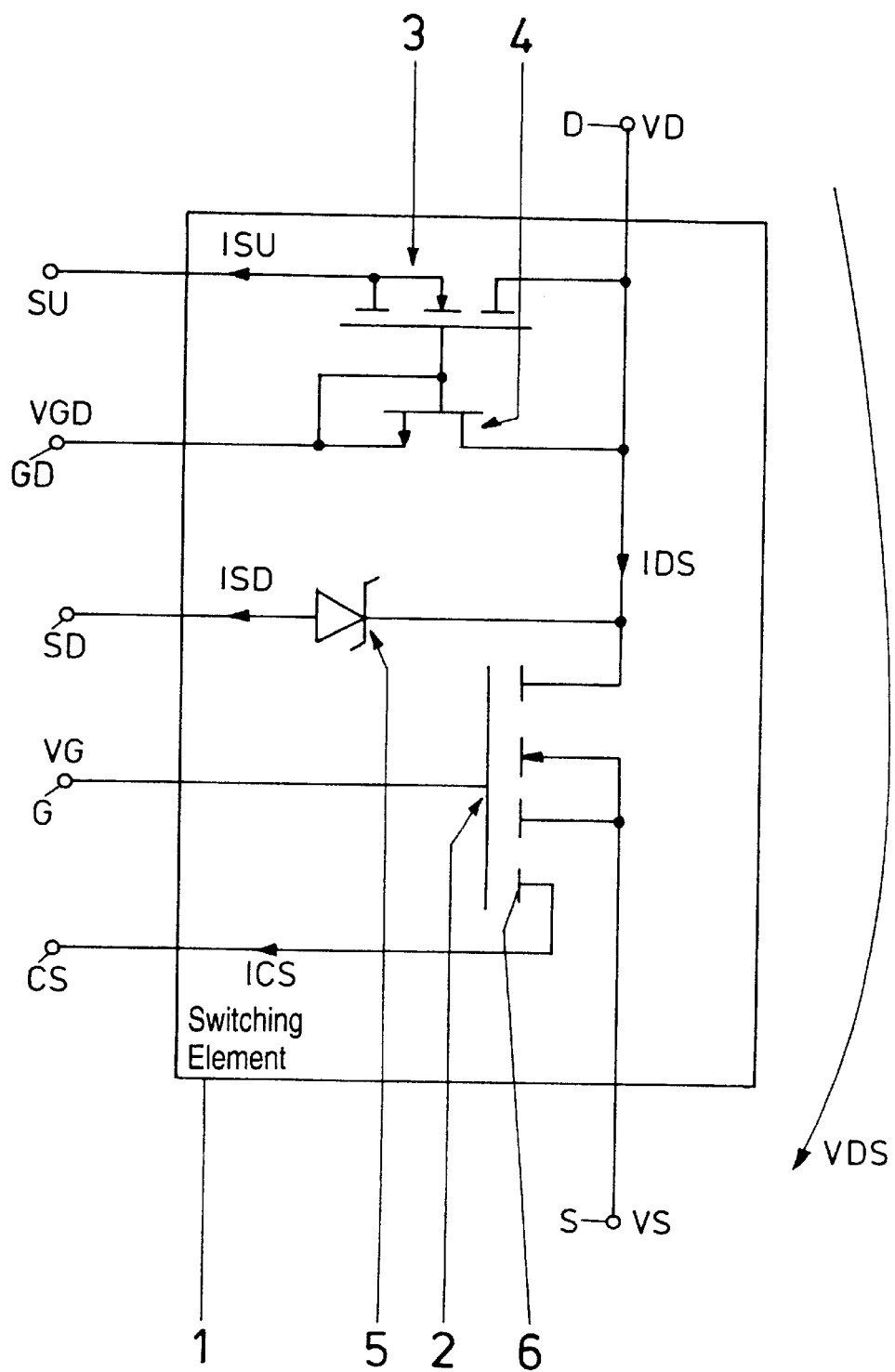
FIG. 1 is a simplified block and schematic circuit diagram of a semiconductor switching element according to the invention.

Referring now to the figures of the drawings in detail and first, particularly to FIG. 1 thereof, there is shown a simplified equivalent circuit of the semiconductor switching element 1 according to the invention.

The semiconductor switching element 1 has a load-break switch 2. In the exemplary embodiment, the load-break switch 2 is in the form of an n-channel MOSFET, and, thus, has a control connection G (Gate) and two load connections D, S, (Drain, Source), which at the same time represent a number of external connections of the semiconductor switching element 1. A drain potential VD is present at the drain connection D and a source potential VS is present at the source connection S so that a drain-source voltage VDS is dropped between these connections, and, hence, across the load path of the semiconductor switching element 1, and a load current IDS flows. The control connection G of the load-break switch 2 can, thus, have a control potential VG applied to it.

In addition to the control connection G and load connections D, S, the semiconductor switching element 1 also has four additional connections SU, GD, SD, CS. Signals relating to the operating state of the semiconductor switching element 1 and to the drive of a drive circuit, which is not illustrated in FIG. 1, can be output/input through each of these connections. To this end, the following remarks are made.

In addition to the load-break switch 2, which is referred to as a main transistor in the following text, the semiconductor switching element 1 also has a further n-channel MOSFET 3, whose drain connection is connected to the drain connection D of the load-break switch D and whose source connection is connected to the first additional output connection SU. In the exemplary embodiment, the n-channel MOSFET 3 is in the form of a controllable current source. The semiconductor switching element 1 furthermore has a transistor 4, which is typically disposed in the diode structure, and whose load path is disposed between the drain connection D of the semiconductor switching element 1 and the second additional input connection GD. The transistor 4 is used to drive the transistor 3. For such a purpose, the control connection of the transistor 3 and the input connection GD are short-circuited to the control connection of the MOSFET 3. A further transistor 5, which is connected in a zener diode configuration, is disposed between the drain connection D and the third additional connection SD.

In the exemplary embodiment, the semiconductor switching element 1, which has a cell-like structure, has a large number of cells that define a cell array. The majority of these cells form the main transistor 2, which is in the form of a MOSFET, and, to such an end, their load paths are connected in parallel. The further transistors 3, 4, 5 are each formed from one or from a small number of cells, but their load paths are not connected in parallel with the respective load paths of the cells that form the main transistor 2. Those parts that contain the transistors 3, 4, 5 are also referred to as cells in the following text.

Optionally, by way of example, the source contacts 6 of individual source cells can be connected in parallel and, together with a further output connection CS, can form a measurement circuit for measuring the load current IDS.

The semiconductor switching element 1 need not necessarily be in the form of a MOSFET, but can highly advantageously also be in the form of an IGBT. However, it is particularly advantageous for the semiconductor switching element 1 to be a so-called compensation semiconductor component. The configuration and method of operation of such compensation semiconductor components are in the prior art, and are described, for example, in U.S. Pat. No. 5,216,275 to Chen and U.S. Pat. No. 4,754,310 to Coe, as well as in International Publication WO 97/29518, corresponding to U.S. Pat. No. 6,184,555 to Tihanyi et al., and in German Patent DE 43 09 764 C2, corresponding to U.S. Pat. No. 5,438,215 to Tihanyi. One particularly advantageous configuration of the semiconductor structure for a semiconductor switching element 1 is described in German Patent Application DE 199 18 028. The entire content of this document is hereby incorporated herein by reference.

Figure 2:
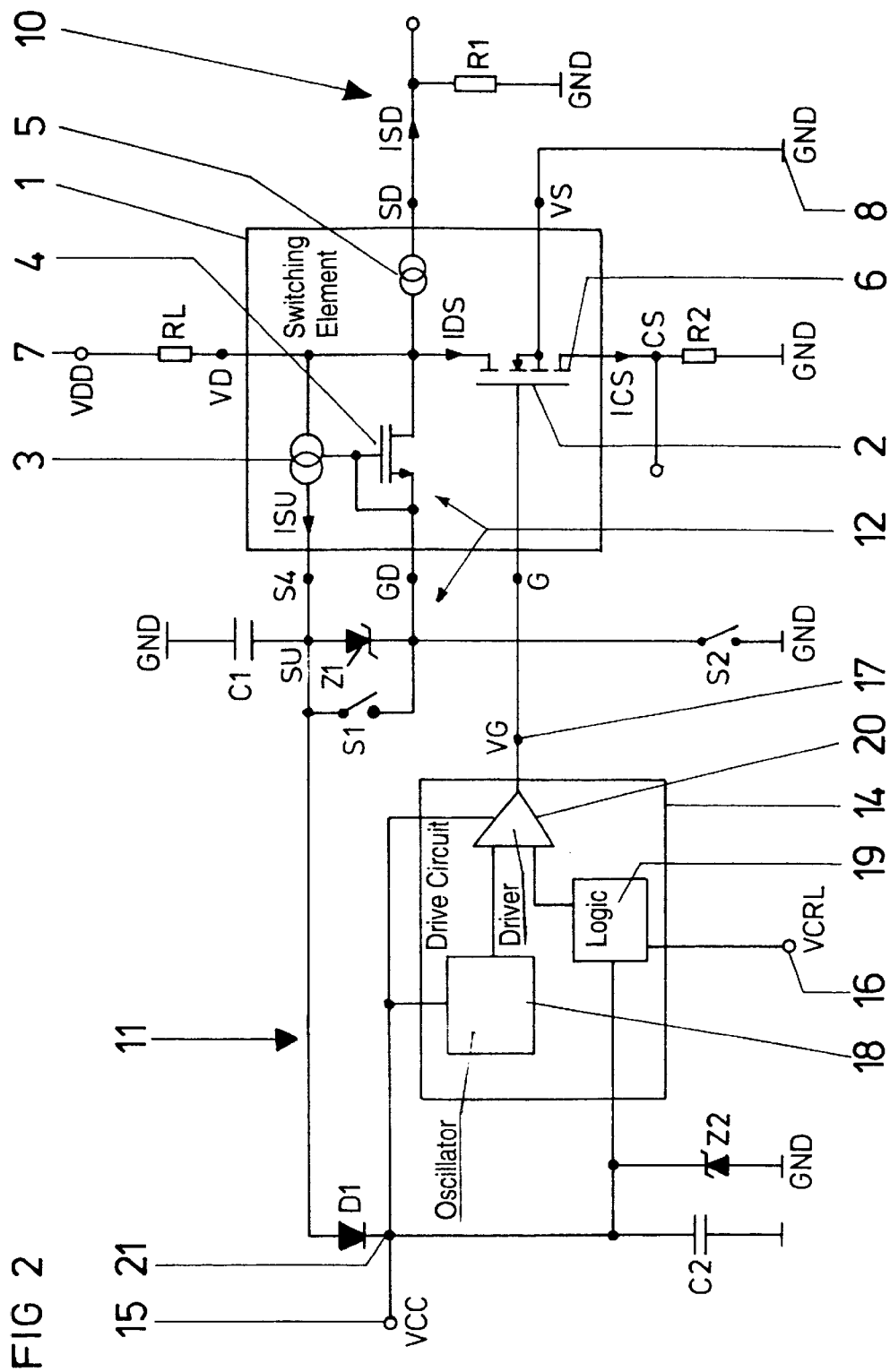
FIG. 2 is a simplified block and schematic circuit diagram of a semiconductor circuit according to the invention having the semiconductor switching element of FIG. 1.

FIG. 2 illustrates a general exemplary embodiment of a semiconductor circuit according to the invention, containing a semiconductor switching element, as shown in FIG. 1.

The load path of the semiconductor switching element 1 is connected in series with a load RL and between the connections 7, 8 of a supply voltage source, which is not illustrated in FIG. 2. In the exemplary embodiment, the first supply connection 7 is at a positive potential VDD, for example, a battery potential, and the second supply connection 8 is at the potential of the reference ground GND.

The transistor 5, which is in the form of a current source in FIG. 2, is part of a status-determining device 10. The current source 5 produces a current signal ISD when the drain-source voltage VDS of the load-break switch 2 exceeds the breakdown voltage level of the transistor 5, which is governed by its doping levels. The current signal ISD can be tapped off at the status output SD of the semiconductor switching element 1. A resistor R1, which is coupled externally to the semiconductor switching element 1, is provided for the protection of the cells of the transistor 5, and is disposed between the status output SD and the connection at the potential of the reference ground GND. The resistor R1 has a resistance such that the drain potential VD is greater than the breakdown voltage of the load-break switch 2 at the maximum current carrying capacity of the cells of the transistor 5.

The current measurement output CS is connected to the respective source connections of the cells 6, which are intended for current measurement. The output CS supplies a current measurement signal ICS into the resistor R2, corresponding to the ratio of the number of current measurement cells to the main cells of the load-break switch 1. The resistor R2 has a resistance such that the voltage drop, caused by the maximum measurement current ICS, across the resistor R2 does not corrupt the current ratio of the measurement current ICS to the load current IDS flowing through the load-break switch 2.

FIG. 2 furthermore shows a drive circuit 14. The drive circuit 14 has a supply input 15 through which a supply potential VCC can be input, and has a control input 16 through which an external control signal VCRL can be input. Furthermore, the drive circuit 14 has an output 17 that is connected to the control input G of the semiconductor switching element 1 and at which a control signal VG can be tapped off. The drive circuit 14 has an oscillator 18, a logic circuit 19, and a driver circuit 20, which are each supplied with the supply potential VCC through the supply input 15. The logic circuit 19, whose input side is connected to the control input 16, and the oscillator 18 are connected on the output side to two inputs of the drive circuit 20.

The transistor 3, which is in the form of a controllable current source in FIG. 2, is a component of a starting device 11. In addition to the controllable current source 3, the starting device 11 has a diode D1 and an energy storage capacitor C2, which are disposed in series with one another, and between the potential of the reference ground GND and the output SU. The center tap 21 of the series circuit including the diode D1 and the energy storage capacitor C2 is connected to the supply input 15 of the drive circuit 14. Furthermore, a further capacitor C1 is provided, which is connected externally between the potential of the reference ground GND and the output SU, and is used as a capacitive load for the initiation of a starting charging current ISU.

The method of operation of the starting device 11 will be explained briefly in the following text.

The starting device 11 is configured such that the controllable current source 3 produces a starting charging current ISU at the output SU only when the load-break switch 2 is switched off. The controllable current source 3, and, hence, also the starting charging current ISU, are, thus, respectively clocked at the switching frequency of the controllable load-break switch 2, with the two transistors 2, 3 typically never being switched on at the same time during normal operation or during starting of the circuit configuration.

When the drive circuit 14, which is illustrated in FIG. 2, is switched off, for example, during a power down mode or standby mode, the drive circuit 14 has no external power supply. Nevertheless, to supply the drive circuit 14 with power immediately during starting, the starting charging current ISU that is produced at the output SU charges the buffer capacitor C2, through the decoupling diode D1 to the supply voltage VCC.

Thus, on starting, the buffer capacitor C2 is already charged to the supply voltage VCC and supplies the drive circuit 14 until it is, once again, supplied with power externally.

The energy that is drawn from the energy storage capacitor C2, and, hence, the supply potential VCC that is produced thereby at the supply input 15 can be limited to a value that is permissible for the drive circuit through a zener diode Z2, which is disposed in parallel with the energy storage capacitor C2. When the main transistor 2 is switched on, the decoupling diode D1 prevents the energy storage capacitor C2 from discharging, so that the supply potential VCC that is produced by the energy storage capacitor C2 is not discharged immediately once again during the first clock pulse during starting, but, in fact, supplies the drive circuit 14 with power for a certain time period.

A gate control device 12, which has the transistor 4, is also provided in FIG. 2. The starting charging current ISU can be switched off again through the gate control device 12, or through the gate control input GD. The controllable current source 3 is switched off for such a purpose by short-circuiting the gate control input GD to the output SU, or by connecting the gate control input GD to the source potential VS of the semiconductor switching element 1. The gate control device 12 has two switches S1, S2 for such a purpose, through which the controllable current source 3 can be switched off. A closed switch S1 and/or S2, thus, prevents the controllable current source 3 from supplying a starting charging current ISU. A zener diode Z1 that is disposed between the gate control input GD and the output SU limits the voltage between these connections to the value that is permissible for a gate oxide of the respective cells of the transistor 3.

To switch the respective cells of the transistor 3 on again, the charge buried under the well of the respective cells of the transistor 4 must be replenished. The process of switching on the transistor 3 through the gate control device 12 and the capacitor C1 by injecting charge carriers from the source region of the main transistor region 2 is described in detail in the German Patent Application DE 199 18 028 A1 cited above.

Figure 3:
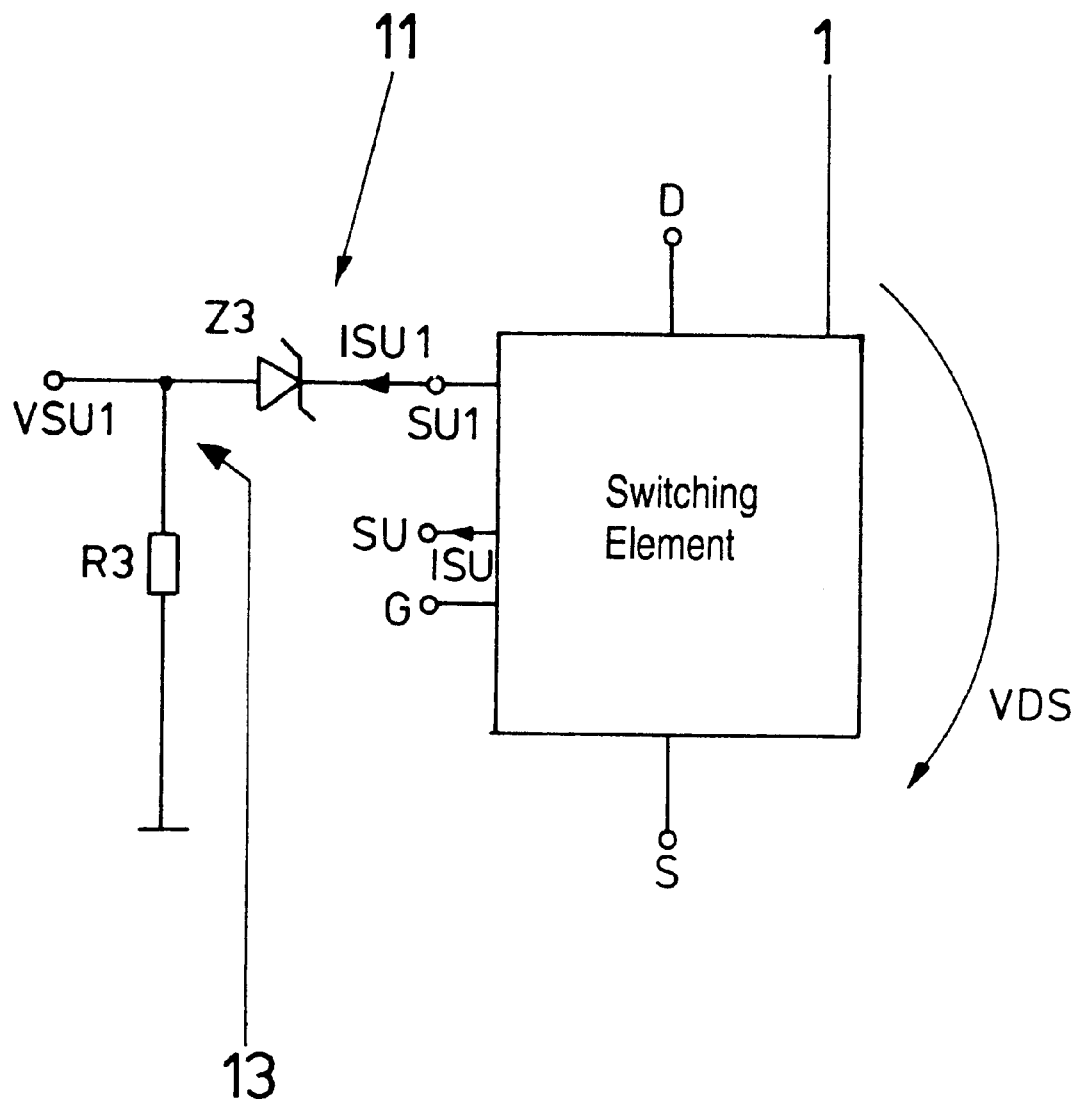
FIG. 3 is a simplified block and schematic circuit diagram of a starting device of FIG. 2.

FIG. 3 shows the use of a starting device 11 that, in addition to the output SU, has an additional output for determining the drain-source voltage VDS. Here, the semiconductor switching element 1 is now shown in the form of a block, which corresponds substantially to the configuration shown in FIG. 1. If the drain-source voltage VDS is less than a voltage that corresponds to the breakdown voltage of the zener diode Z3 plus the threshold voltage of the respective cells of the transistor 3, then the zener diode Z3 conducts currents and the transistor 3 is switched to the switched-off state, thus, blocking the current ISU produced by the starting device 11. The value of the drain-source voltage VDS of the main transistor 2 can, thus, be detected across the resistor R3. When the main transistor 2 is switched off, the monitoring device 13 makes it possible, for example, to identify oscillation of the drain potential VD with respect to the source potential VS and a short circuit through the load path of the main transistor 2.

The outline circuit configuration shown in FIG. 2 and the refinement shown in FIG. 3 also allow a semiconductor circuit with an intelligent, clocked semiconductor switching element to be produced, which can switch itself on when required, but is not switched on or switched off in certain conditions. Particularly in switch-mode power supplies, clocked powered supplies, current regulators, and the like, such a configuration results in advantageous applications, which allows a significant reduction in the external circuitry required for these additional functionalities and is highly attractive from a cost point of view because the power losses are minimized one use of the monitoring device 13 as shown in FIG. 3 in conjunction with the starting device 11 as shown in FIG. 2 will be described in the following text (see FIG. 5).

In the exemplary embodiments described below, the semiconductor circuit according to the invention is in the form of a switch-mode power supply. Further advantageous refinements and developments of the invention will be explained with reference to these switch-mode power supply applications.

Figure 4:
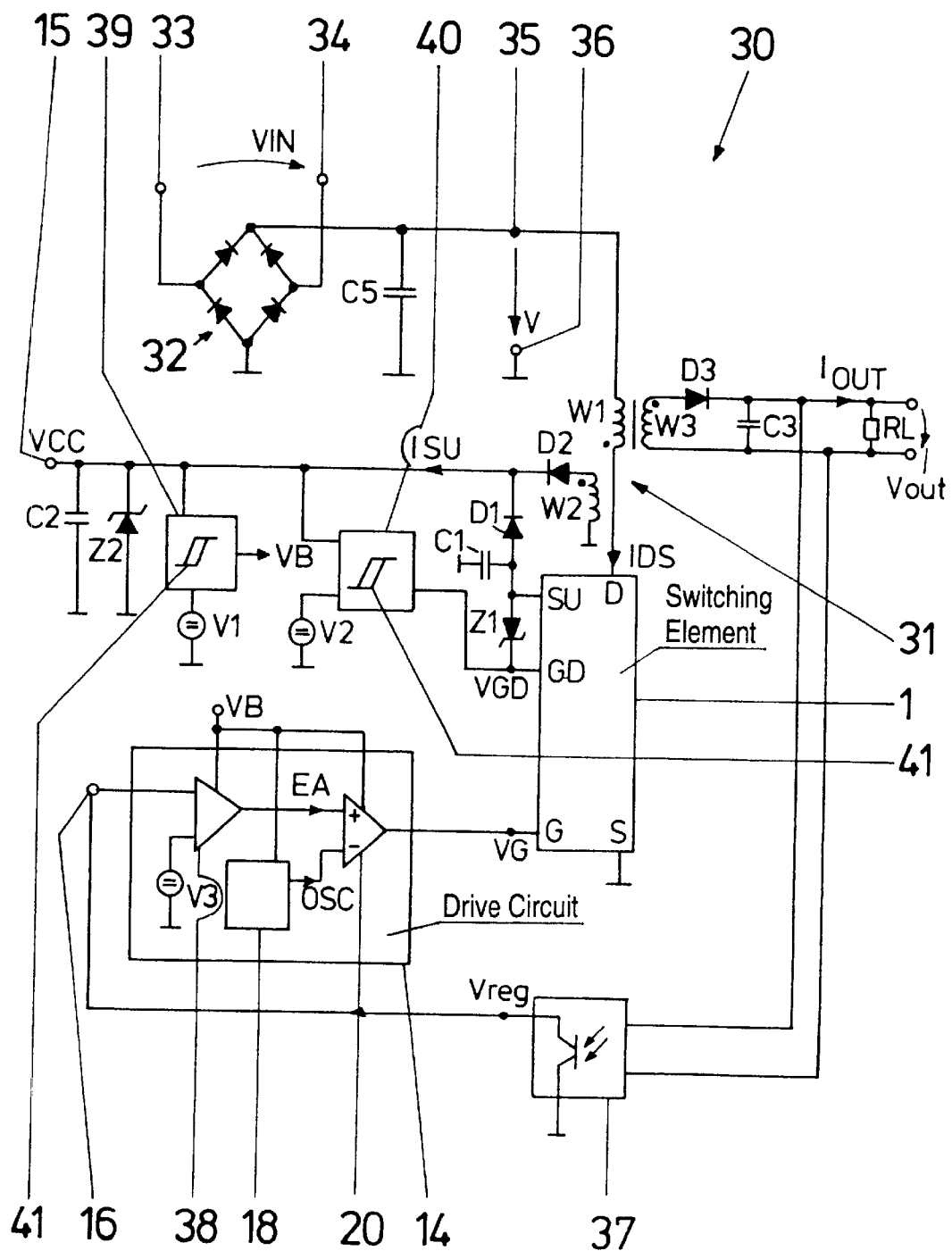
FIG. 4 is a simplified block and schematic circuit diagram of the semiconductor circuit according to the invention as a flyback converter switch-mode power supply.

FIG. 4 illustrates the semiconductor circuit according to the invention in the form of a switch-mode power supply. The switch-mode power supply, which is annotated by the reference symbol 30 in FIG. 4, is in the form of a flyback converter. The switch-mode power supply 30 has the semiconductor switching element 1 and a drive circuit 14 driving the element 1. The semiconductor switching element 1, which is intended for applying a rectified supply voltage V to a primary coil W1 of a transformer 31, is, for such a purpose, connected in series with the primary coil W1. The supply voltage V is produced by rectification with a bridge rectifier 32 and by smoothing with a capacitor C5 from an AC mains voltage VIN, which can be input into the switch-mode power supply 30 through the input terminals 33, 34. The supply voltage V so rectified can be tapped off across the smoothing capacitor CS, which is disposed in parallel with the series circuit formed by the primary coil W1 and the semiconductor switching element 1, and between the two intermediate circuit connections 35, 36.

When the semiconductor switching element 1 is closed, the primary coil W1 draws power, which is emitted immediately after the opening of the semiconductor switching element 1, from the primary coil W1, through a secondary coil W3 of the transformer 31 and a rectifier configuration D3, C3 to the load RL. In FIG. 4, the rectifier configuration D3, C3 includes a diode D3 connected in series with the load RL and a capacitor C3 disposed in parallel with the load RL. The smoothing capacitor C5 at the input of the switch-mode power supply 30 and the capacitor C3 at the output of the switch-mode power supply 30 are typically in the form of electrolytic capacitors. In the flyback phase of the semiconductor switching element 1, that is to say, when the load-break switch 2 is in the closed position, the capacitor C3 is charged through the diode D3 by reversing the polarity of the voltage applied to the secondary winding W3. The output voltage Vout that is dropped across the load RL is supplied through a feedback path to an optocoupler 37 that, on the output side, produces a potential Vreg that is dependent on the output voltage Vout.

The drive circuit 14 is provided for driving the semiconductor switching element 1. The drive circuit 14 includes an error amplifier 38 and an oscillator 18 that, on the output side, drive the inputs of a driver circuit 20. In the switch-mode power supply shown in FIG. 4, the driver circuit 20 is in the form of a PWM driver. The oscillator 18, the error amplifier 38, and the PWM driver 20 are each supplied through the supply potential VB. The semiconductor switching element 1 is driven with a gate control signal VG based upon the potential Vreg produced by the optocoupler 37. The potential Vreg is input into a first input 16 of the error amplifier 38, and is compared with a reference potential V3, which is input into the second input of the error amplifier 38. Depending on the comparison, the error amplifier 38 produces an output signal EA, which is input into the PWM driver 20. The driver circuit 20, which is in the form of a pulse width modulator, uses this, in a conventional manner, to produce the drive pulses VG at preferably periodic time intervals, whose respective time durations vary as a function of the load-dependent control signal Vreg, an oscillator signal OSC and a measurement signal from the load current IDS, which is not shown in FIG. 4, so that, if the loads RL change, and/or the intermediate circuit voltage V changes, a DC voltage Vout that is present across the load RL can be kept very largely constant. The energy that is emitted to the load RL is dependent on the frequency and the duration of the drive pulses VG.

As already mentioned, the drive circuit 14 is supplied through the supply potential VB. An additional primary winding W2, which is connected to ground, is provided to produce the supply potential VB, and the starting charging current ISU charges the capacitor C2 through it in a conventional manner. The supply potential VCC is then present across the capacitor C2, and can be used to obtain the supply potential VB for the drive circuit 14. A circuit for identifying undervoltages (undervoltage lockout) 39 is provided to obtain the supply potential VB. The circuit 39 compares the supply voltage VCC with a reference voltage V1. If the voltage falls below the minimum voltage V1 required to drive the gate, the supply potential VB required to supply the drive circuit 14 is produced at the output of the circuit 39.

The drive circuit 14 typically has a power management device, which is not illustrated in FIG. 4 but has an energy-saving operating mode—for example, the initially mentioned power down mode and/or the standby mode. In the power down mode and standby mode, the large majority of all the functional elements of the switch-mode power supply 30 are switched off, with the exception of the drive circuit 14. When in the switched-off state, the power consumption of the switch-mode power supply 30 is, thus, virtually negligibly small, but, in the operating mode, the drive circuit 14 cannot be supplied with power through the additional primary winding W2.

For such a purpose, the switch-mode power supply 30 has a starting device 11 (see FIGS. 2 and 3), which produces a starting charging current ISU, even in the switched-off state, through the semiconductor switching element 1. The starting device 11, and, hence, the switch-mode power supply 13 as well, can be "woken up" again from the standby mode, and can be switched to the normal operating mode, by the starting charging current ISU.

The configuration of the starting device 11 and of the gate control device 12, that is to say, the diode elements D1, Z1, and the capacitive elements C1, C2 carry out the function as in the example in FIG. 2.

Applying the rectified supply voltage V starts the switch-mode power supply 30. The semiconductor switching element 1, which is still switched off, supplies the starting charging current ISU through the diode D1 at its output connection SU, and is used to charge the energy storage capacitor C2. Once the minimum voltage V1, which is required for driving the gate of the semiconductor switching element 1 for starting the switch-mode power supply 30 has been exceeded, then the circuit 39 switches the supply potential VB to the individual functional units 18, 20, 38 of the drive circuit 14. The switch-mode power supply 30 is, thus, clocked through the gate drive signal VG. Accordingly, the capacitor C1 is additionally charged through the additional primary winding W2 and the diode D2.

The switch-mode power supply 30 also has a gate control device 12 for controlling the starting device 11. The gate control device 12 has a comparator device 40, which is typically in the form of a comparator. The comparator device 40 is connected on the input side to a reference potential V2 and to a connection 15. The zener diode Z2, whose breakdown voltage is higher than the reference potential V2, limits the supply potential VCC. On the output side, the comparator device 40 is coupled to the input connection GD of the gate control device 12. If the voltage range required for operation of the switch-mode power supply 30, that is to say, VCC V2, is exceeded, then the comparator device 40 switches the input connection GD to the potential of the source connection S, and, thus, switches the starting device 11 to a switched-off state. As such, the periodic charging current ISU, which is produced by the starting device 11, is switched off.

In one particularly advantageous refinement of the switch-mode power supply in FIG. 4, it is even possible to dispense with the additional primary winding, W2. In such a case, the starting charging current ISU must be chosen to be sufficiently large that the mean current drawn by the functional units 18, 20, 38 that are fed from the supply voltages VCC and VB for the drive circuit 14 is less than the starting charging current ISU flowing into the energy storage capacitor C2.

The comparator device 40 and the circuit 39 advantageously have switching hysteresis 41, which makes it possible to ensure that the starting charging current ISU is activated after the starting of the switch-mode power supply 30 only when the supply voltage VCC leaves the window, which is predetermined by the hysteresis 41 of the comparator device 40, for the supply potential VCC. Accordingly, the mean starting charging current ISU that is supplied from the starting device 11 is automatically matched to the current draw required by the functional units 18, 20, 38 of the drive circuit 14 and the functional units 39, 40. The reactivation of the starting charging current ISU, that is to say, switching the starting device 11 on again, is carried out by an output level of the output signal VGD produced by the comparator device 40. The value of such a control potential VGD must be at least as high as a voltage that is equivalent to the threshold voltage of the respective cells of the transistor 3 plus the supply potential VCC plus the forward-biased voltage of the diode D1. The voltage increase, which is typically in the range 5 to 10 volts, is produced by the comparator device 40, for example, through a charge pump.

The comparator device 40 is supplied from the supply potential VCC. The comparator device 40 advantageously has a tristage output, at which its output can also be set to a high-impedance state in addition to producing the two signals high and low.

In an alternative embodiment, the comparator device 40 together with the reference potential V2, can also be omitted. Any excess current produced by the starting device 11 can then be dissipated, for example, through the zener diode Z2. The supply potential VCC is in such a case set to the value of the breakdown voltage of the zener diode Z2. However, the last-mentioned alternative is less efficient than a switch-mode power supply 30 equipped with a comparator 40.

Figure 5:
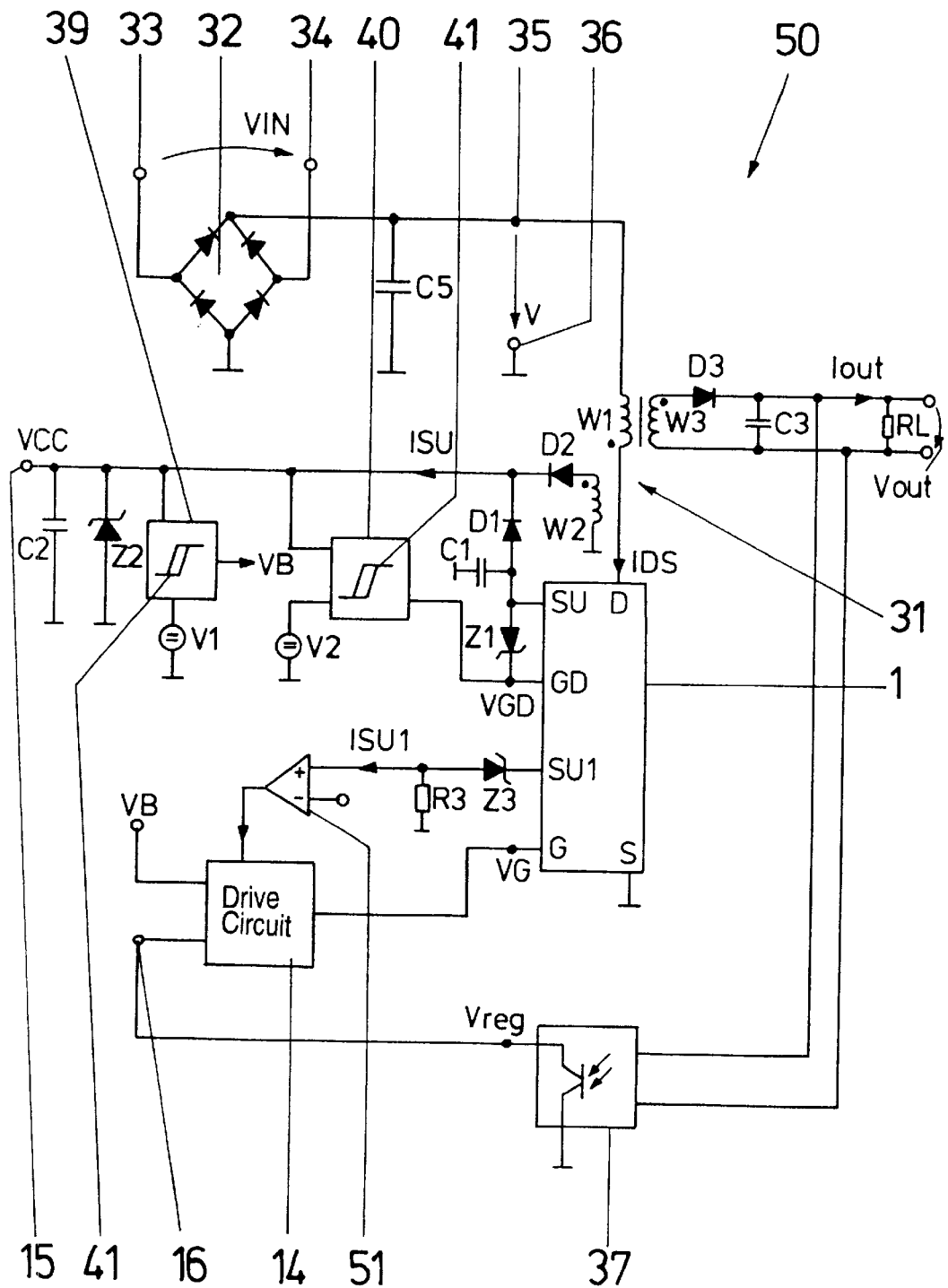
FIG. 5 is a simplified block and schematic circuit diagram of the semiconductor circuit according to the invention as a quasi-resonant switch-mode power supply.

FIG. 5 illustrates the configuration of a semiconductor circuit according to the invention in the form of a quasi-resonant switch-mode power supply. The configuration of a switch-mode power supply in general and of a quasi-resonant switch-mode power supply in particular have already been explained with reference to the previous exemplary embodiment in FIG. 4, and in the already mentioned prior art. The following text will, therefore, describe only those features of a quasi-resonant switch-mode power supply that differ from the initially mentioned prior art and/or from the switch-mode power supply shown in FIG. 4.

In quasi-resonant switch-mode power supplies, it is necessary to prevent the load-break switch 2 from being switched on if the intermediate circuit voltage V is too low because, otherwise, the load current IDS through the primary winding W1 that is connected in series with the load path of the load-break switch 2 would reach unacceptably high levels, resulting in saturation of the core of the transformer 31. The inductance of the primary winding W1 would then assume such low values that short-circuit current resulting therefrom would overload or destroy the load-break switch 2.

To prevent such from occurring, the prior art typically provides an evaluation circuit that monitors the intermediate circuit voltage across a resistive divider, with the voltage at the voltage divider tap being compared with a minimum value, by a comparator. However, such an evaluation circuit according to the prior art requires extremely complex circuitry.

Figure 6:
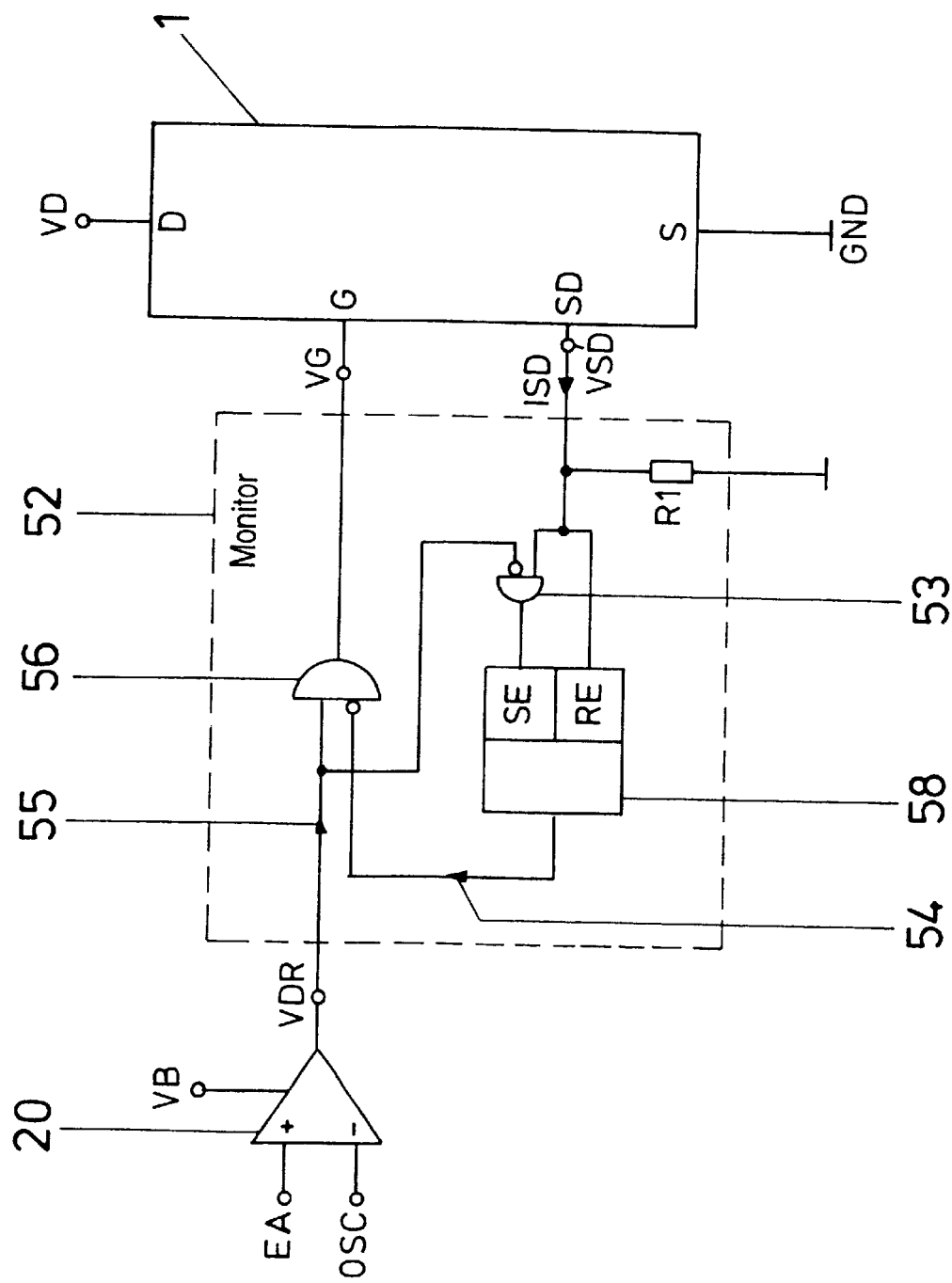
FIG. 6 is a simplified block and schematic circuit diagram of a monitoring device for identification of overvoltages according to the invention.
Figure 7:
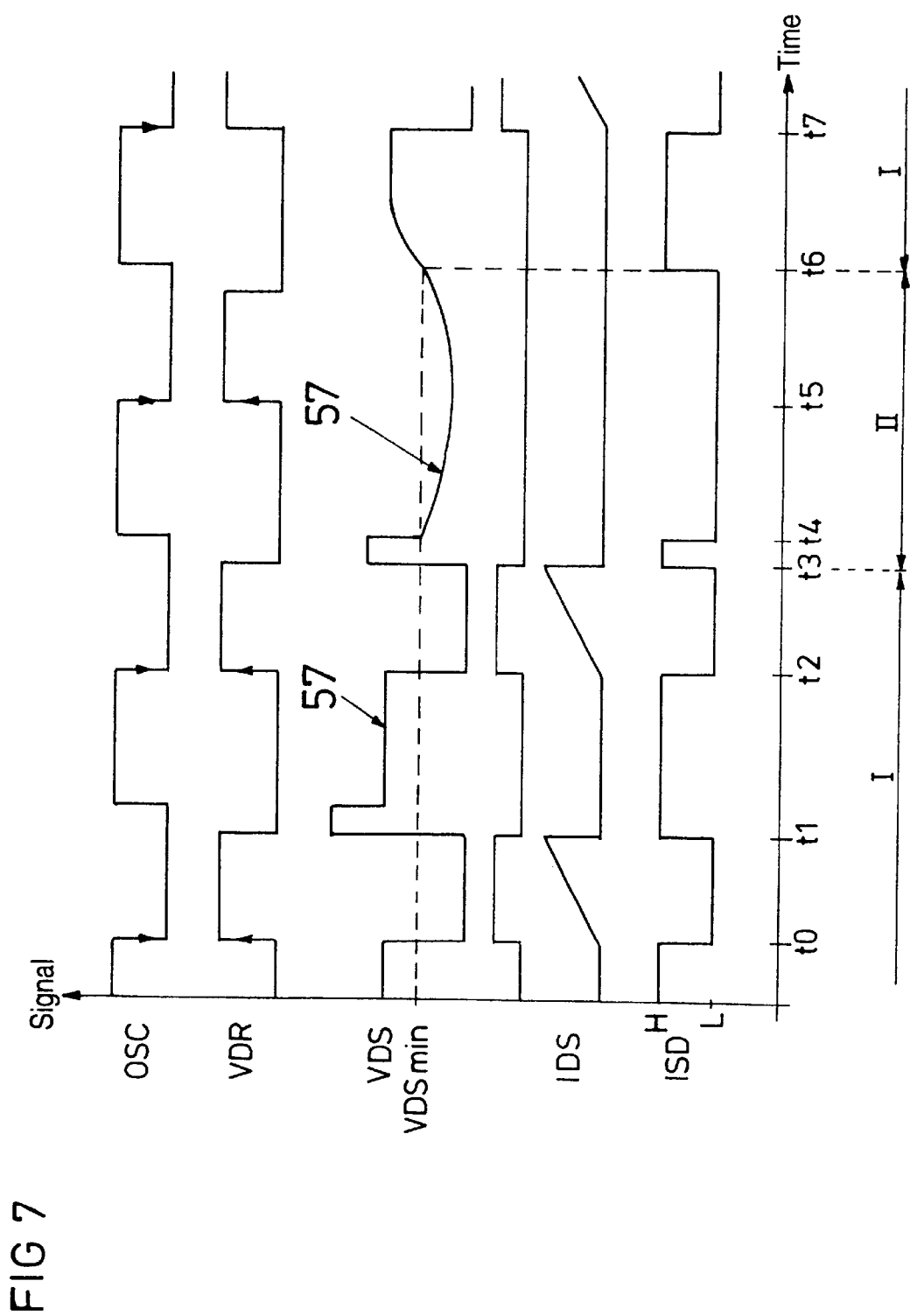
FIG. 7 is a signal/time graph for the circuit configuration of FIG. 6 indicating where a mains voltage is temporarily too low.

FIG. 7 shows a signal/time graph for a circuit configuration corresponding to that in FIG. 6 for detection of an intermediate circuit voltage that is temporarily too low. In FIG. 7, the time period between the times t0 and t3 denotes the normal mode I, and the time period between the times t3 to t6 denotes the case where the intermediate circuit voltage is temporarily too low, that is to say the undervoltage mode II.

In the undervoltage mode II, the drain-source voltage VDS—at least in the plateau area 57—is less than the minimum permissible drain-source voltage VDSmin, that is to say, it is less than the minimum intermediate circuit voltage V. The gate drive signal VG is then not switched on at the time t5 on the falling flank of the oscillator output signal OSC by the monitoring device 52 as shown in FIG. 6, but is not switched on until the time t7, that is to say, only when the drain-source voltage VDS has once again risen above the minimum permissible drain-source voltage VDSmin. If the time interval t4 to t6 does not just last for one clock period of the oscillator 18, but lasts for a number of clock periods, then the corresponding clock pulses of the gate drive signal VG are masked out. If, as a consequence thereof, the supply voltage VCC falls below the minimum value V2 (see FIG. 4), then the switch-mode power supply remains switched off, and can be started again only by switching the intermediate circuit voltage V off and on.

A status-determining device 10 and a monitoring device 52 downstream from it advantageously mean that there is no need for a circuit configuration for undervoltage identification. The monitoring device 52 in conjunction with the status determining device 10 are, thus, able to detect and to evaluate an undervoltage or a voltage drop in the drain-source voltage VDS and, thus, in the intermediate circuit voltage V, and to switch off the semiconductor switching element 1 automatically, depending on the requirement and configuration. The particular advantage is that there is no need whatsoever to take any account of a time constant resulting from the time constant of the energy storage capacitor C2. The monitoring device, thus, advantageously has improved reliability, in particular, because more degrees of freedom are allowed for the transformer configuration.

In quasi-resonant switch-mode power supplies, it is necessary to ensure that the load-break switch 2 is as far as possible always switched on at a time at which the current through the secondary winding W3 is passing through zero. If, in the ideal case, the load-break switch 2 is always switched on at a zero crossing of the secondary current Iout, then the quasi-resonant switch-mode power supply has the minimum circuitry-dependent power losses.

The quasi-resonant switch-mode power supply 50 according to the invention and as shown in FIG. 5 uses a starting device 11 with two outputs SU, SU1 to detect and evaluate the zero crossing. The energy storage capacitor C2 is charged with a starting charging current ISU through the first output connection SU, as shown in FIGS. 2 and 4. The starting device 11 furthermore has a detector device 13, configured as shown in FIG. 3. A signal VSU1, which provides information about the drain-source voltage VDS of the semiconductor switching element 1, can be tapped off at the further output connection SU1 of the starting device 11.

A drop in voltage, which starts with the switching-off process, starts at the time of zero crossing of the secondary current flowing through the secondary winding W3. The drop in voltage can be detected through the starting device 11 by providing the status signal VSU1. The status signal VSU1, which can be tapped off at the further output connection SU1, supplies a current ISU1 to the resistor R3. The breakdown voltage of the zener diode Z3 is chosen here such that, as a consequence of the detected voltage drop, the current ISU1 flowing from the further output connection SU1, and, hence, the voltage drop VSU1 across the resistor R3, assume the value zero. The signal resulting therefrom can be compared with a reference signal in a comparator 51. The comparator output signal is input into the drive circuit 14. It is then possible through the drive circuit 14 and through a logic device that is provided in the drive circuit 14 to switch on the load-break switch 2 and the semiconductor switching element 1 at a zero crossing of the secondary current in each case. In contrast to quasi-resonant switch-mode power supplies according to the prior art, there is advantageously no need whatsoever for any additional primary winding or evaluation circuit for such a purpose.

FIG. 6 shows an exemplary embodiment of a monitoring circuit for monitoring the intermediate circuit voltage V by a semiconductor switching element 1 according to the invention.

In FIG. 6, the monitoring device 52 is annotated with the reference symbol 52. A status signal VSD that can be tapped off at the status output SD and provides information about the measured drain-source voltage VDS of the switched-off semiconductor switching element 1, and, hence, also indirectly about the intermediate circuit voltage V, supplies a status current ISD to the resistor R1. The monitoring device 52 has a flipflop 58. The current ISD is input into the reset input RE of the flipflop 58. Furthermore, the status signal ISD is input together with an inverted output signal from the pulse-width modulator VDR into an AND gate 53, whose output signal is supplied to the set input SE of the flipflop 58. The flipflop 58 produces an output signal 54 that is input, in inverted form and together with the output signal 55 of the pulse-width modulator, into a further AND gate 56. The AND gate 56 produces, at its output, the gate drive signal VG, which is supplied to the gate connection G of the semiconductor switching element 1.

The flipflop 58 is reset by the rising flank of the status signal ISD, which can be tapped off at the output SD to a low logic level, and is set by the falling flank of the status signal ISD to a high logic level. However, the high level is set only when the drive potential VDR of the pulse-width modulator 20 is at a low level. When the semiconductor switching element 1 is switched off, the transistor in the status determining device 10 checks the plateau region of the drain-source voltage, which is annotated 57 in FIG. 7 for a minimum permissible drain-source voltage VDSmin. If the drain-source voltage VDS is greater than the minimum permissible drain-source voltage VDSmin—as, for example, during normal operation I—then the load-break switch 2 is switched on by a gate control signal VG when the next clock pause occurs in the oscillator signal OSC. A load current IDS rising with a triangular waveform then flows through the load path of the load-break switch 2, and, hence, also through the primary winding W1.

A circuit configuration as shown in FIG. 6 also makes it possible to monitor the output voltage Vout for an overload or short circuit in the switch-mode power supply.

Figure 8:
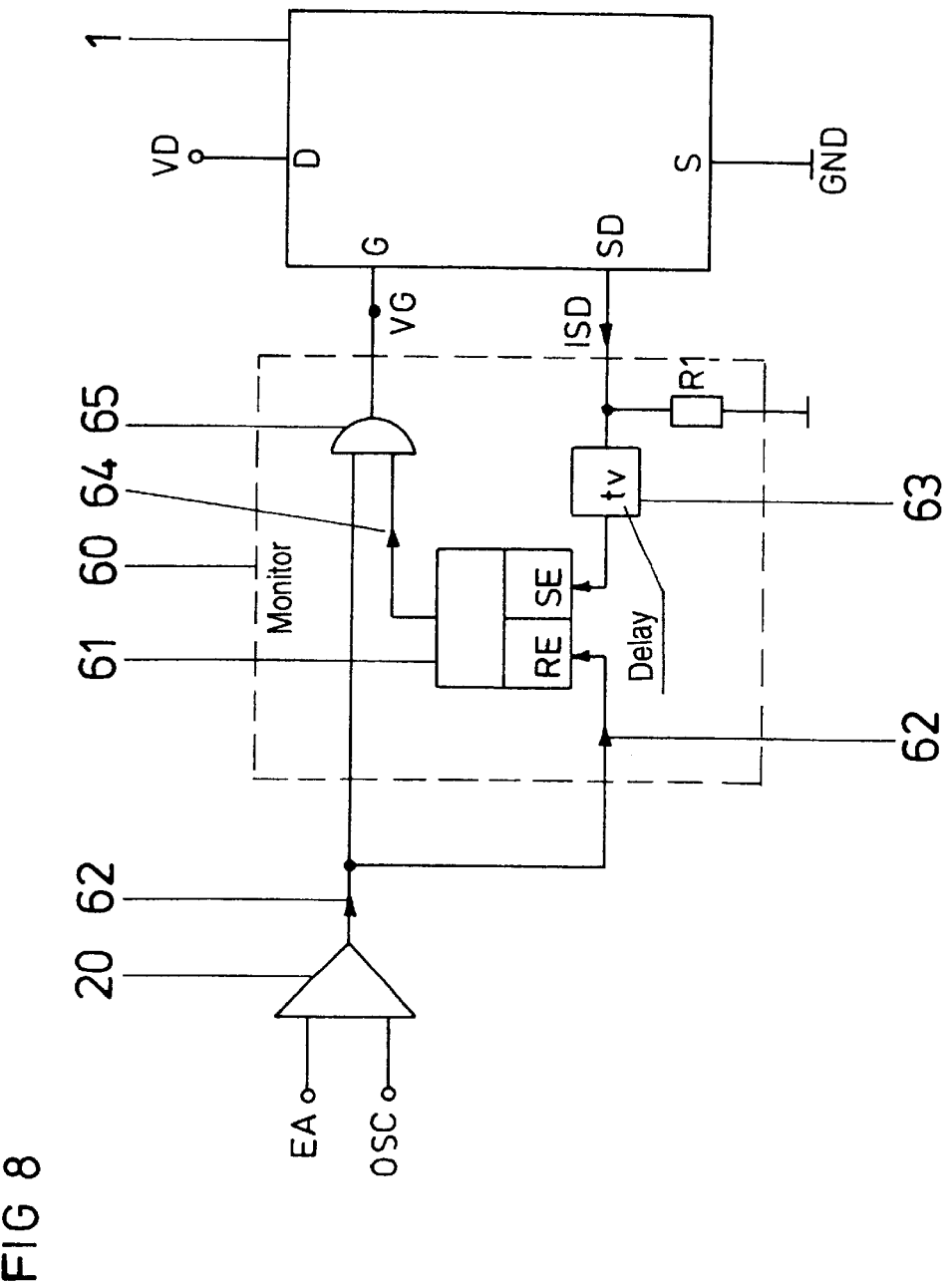
FIG. 8 is a simplified block and schematic circuit diagram of another embodiment of the monitoring device according to the invention for identification of a short circuit on a secondary side.

FIG. 8 shows an exemplary embodiment of the circuitry for detection of an overload on the secondary side, or short circuit on the secondary side, by a monitoring device 60. Once again, the monitoring device 60 is connected downstream from the status determining device 10 and has a resistor R1 for producing the status current ISD. The monitoring device 60 also has a flipflop 61, into whose set input SE the status signal ISD is input, and into whose reset input RE the output signal 62, which is supplied from the pulse-width modulator 20, is input. A delay device 63 with a time constant TV is typically provided between the set input SE and the status output SD and is used to make it possible to ignore overshoots at the start of the measurement of the drain-source voltage VDS. The output signal 64 from the flipflop 61 is input together with the output signal 62 from the pulse-width modulator to an AND gate 65, with the gate drive signal VG being produced at the output of the AND gate 65.

Figure 9:
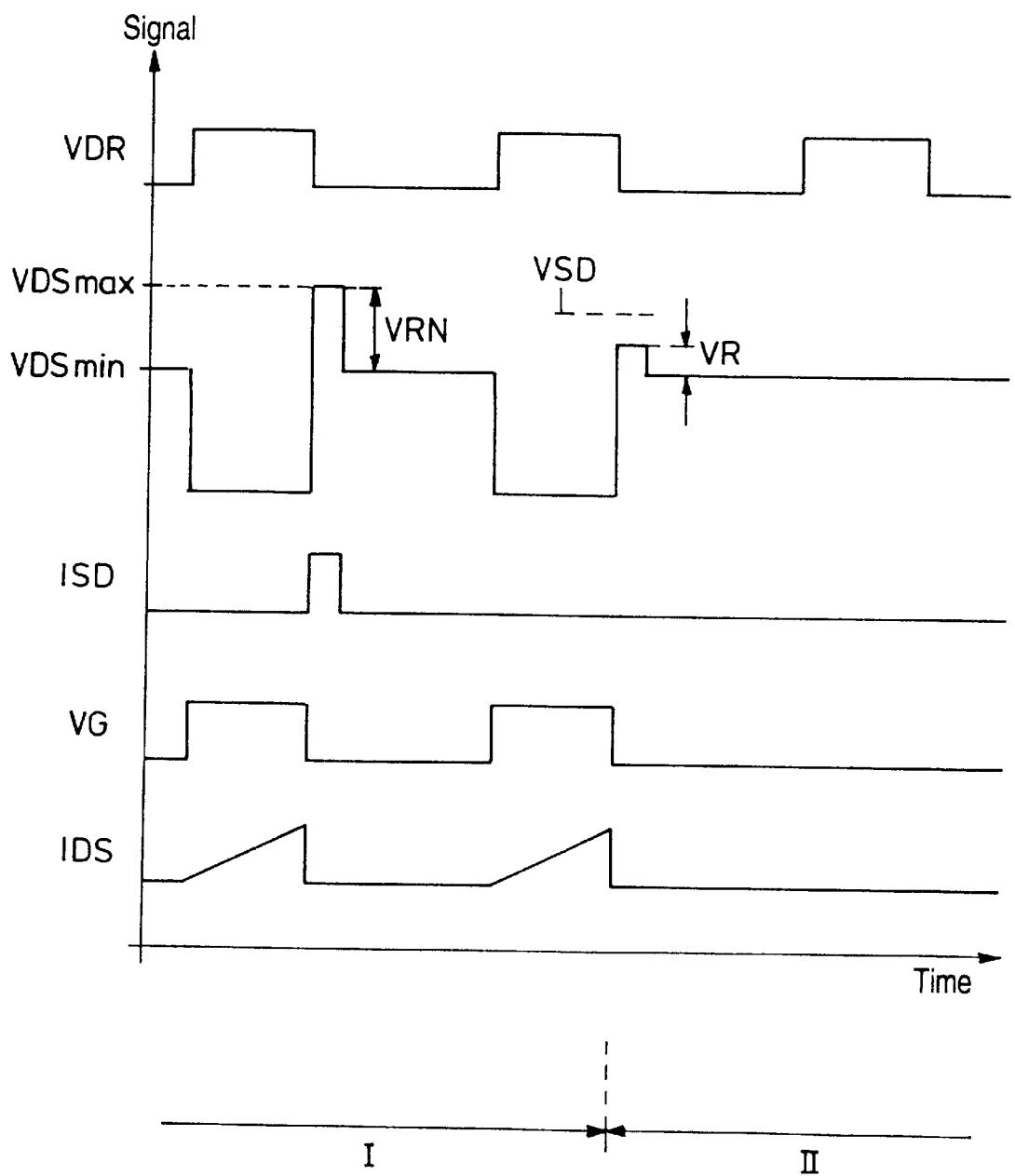
FIG. 9 is a signal/time graph of the circuit configuration of FIG. 8 for switching off in the event of an overvoltage.

The method of operation of the monitoring device 60 as shown in FIG. 8 will be explained in the following text with reference to the signal/time graph shown in FIG. 9. In FIG. 9, the time period I once again denotes normal operation, and the time period II denotes the overload situation, or a short-circuit situation.

In FIG. 9, VDSmin denotes the minimum drain-source voltage, and VDSmax denotes the maximum drain-source voltage. During normal operation, VDSmax=VDSmin+ VRN, where VRN denotes the nominal reflection voltage VR. During normal operation, VRN is typically equal to Vout×W1/W3. The value of the nominal reflection voltage VRN, thus, provides information about the voltage Vout at the output. In the event of an overload or short circuit of the output voltage Vout on the secondary side, the reflection voltage VR is less than the nominal reflection voltage VRN.

According to the invention, the breakdown voltage VSD of the transistor in the status-determining device 10 occurs in a voltage range between VDSmax and VDSmin. The reflection voltage VR can be determined through the status-determining device 10 and the downstream monitoring device 60. The nominal reflection voltage VRN is typically about 100 V. If the reflection voltage VR falls below the value of the breakdown voltage VSD, which is governed by the cells of the transistor 5 in the status-determining device 10, then the output voltage Vout on the secondary side is below the nominal value required during normal operation. The monitoring device 60 in consequence identifies an overload or short circuit on the secondary side. The output SD from the status-determining device 10 does not then produce any status current ISD, which is detected through the monitoring device 60, and the semiconductor switching element 1, and, hence, the switch-mode power supply, are switched off through the logic process carried out in the flipflop 61 and the AND gate 65. In such a case, the flipflop 61 is reset by the falling flank of the output flank 62 from the pulse-width modulator 20, and is set by the rising flank of the status current ISD—taking into account a delay time tv. Through the AND gate 65 and the output signal 62, the output of the flipflop 61 governs whether the gate connection G of the semiconductor switching element 1 is opened or closed.

The controllable load-break switch 2 is intended for switching high voltage and/or currents and, for such a purpose, is in the form of a power MOSFET, in particular, an enhancement MOSFET. However, any other controllable switch is suitable for switching the corresponding voltages and/or currents would, of course, also be feasible for such a purpose.

In the exemplary embodiments, the semiconductor circuit according to the invention has been explained with reference to a quasi-resonant switch-mode power supply and with reference to a switch-mode power supply in the form of a flyback converter. However, the invention is not exclusively restricted to these applications but can, in the same sense, be applied to other converter types, for example, flux converters, resonant converters, and the like. Furthermore, the invention is not exclusively restricted to switch-mode power supplies, but can highly advantageously also be extended to other semiconductor circuits and semiconductor topologies, for example, to half-bridge circuits, bridge circuits, and the like.

The particular advantage of the invention is that the semiconductor switching element need not actually be configured and optimized for all switch-mode power supplies, switch-mode regulators, and power supplies. The semiconductor circuit according to the invention and the semiconductor switching element contained therein can be used for all such circuit configurations that require a clocked semiconductor switch with the functionalities actually described above. Only a minimal amount of additional external circuitry complexity is required here. It is particularly advantageous for the semiconductor switching element and the drive circuit to be monolithically integrated as a single semiconductor chip. It is also advantageous for the status determining device and/or the starting device and/or the gate control device and/or a monitoring device also to be integrated in the semiconductor switching element and/or in the drive circuit.

In summary, it can be stated that, apart from those switch-mode power supply applications that have been described based upon the exemplary embodiments above, the invention makes it possible to provide an "intelligent" controllable switch, which has at least some of the functionalities set forth in the following text.

Start Control

A starting charging current ISU can be produced through a starting device 11, which allows a supply potential VCC, VB to be produced for supplying a drive circuit 14 with a clocked semiconductor switching element 1. The starting device 11 need not necessarily be used just for starting a drive circuit 14 or a switch-mode power supply, but can also, provided it is configured appropriately, be used for providing a supply potential to the drive circuit 14 all the time.

Monitoring of the Drain-Source Voltage

In a clocked semiconductor switching element 1 operated in the steady state, the drain-source voltage VS can be monitored by a starting device 11 or a monitoring device 13. An inverter, connected downstream from these devices 13, 11, and an AND gate make it possible to inhibit the gate drive when the drain-source voltage VDS, with the semiconductor switching element 1 switched off, exceeds a maximum drain-source voltage value VDSmax, which is defined by the respective output SU or SU1 Such a measure advantageously makes it possible to prevent the load current IDS from being switched on above an overvoltage VDSmax, and allows the load current IDS to be switched off using a clocked load-break switch 2. Instead of using an inverter, the functionality can also be achieved through a hold circuit equipped with a flipflop.

Overvoltage Switching On

A monitoring device, which has no inverter but has an AND gate in the gate drive path, allows the semiconductor switching element 1 to be switched on positively in the event of an overvoltage, that is to say, when VDS>VDSmax. The configuration makes it possible to provide protection circuits for reducing overvoltages in a very simple and elegant manner, in which case, a detected overvoltage may assume any defined value. All that is necessary here is that the maximum overvoltage to be detected is greater than the maximum load circuit voltage VDmax.

Overload/Short-Circuit Identification and Switching Off

If the respective outputs SU and SD are configured appropriately for the purpose of monitoring the drain-source voltage VDS, they do not produce any output signal when the semiconductor switching element 1 is switched off and the drain-source voltage VDS is less than a minimum permissible value VDSmin. Such a condition is interpreted as an overload or short circuit on the load path between the drain connection D and the source connection S. All that is necessary here is to ensure that the minimum permissible drain-source voltage VDSmin is less than the supply voltage V. In such a case, the drain-source voltage VDS can be monitored to identify a short circuit when the semiconductor switching element 1 is switched off. The semiconductor switching element 1 can then be opened or switched off through a fault or switch-off signal from a monitoring device 52, 60, thus, providing protection against damage and destruction. In an alternative refinement, the monitoring device 52, 60 may also be in the form of a hold circuit containing a flipflop.

Excessive Temperature Switching Off

The semiconductor switching element 1 according to the invention can be used as a clocked switch, which switches itself on, and switches off in the event of an excessive temperature, by a zener diode Z1 that is disposed between the output connection SU and the gate control input GD. The starting charging current ISU is switched off in a conventional manner by the gate control device 12, and, hence, the gate potential of the transistor 3 is connected, respectively, to the potential at the source connection S and to the potential at the output SU. If a zener diode Z1, a limiter circuit, or an integrated circuit that supplies a sufficiently large blocking current or has a low internal resistance at high temperature is used between the connections GD, SU, then the configuration can be used to switch off the starting charging current ISU in the event of an excessive temperature. Such a switching-off process results in the supply voltage VCC falling below the threshold value for the gate control potential VG, which is required to switch on the semiconductor switching element 1. The semiconductor switching element 1 is, thus, protected against damage or destruction caused by high temperatures.

In summary, it can be stated that the semiconductor circuit according to the invention and configured as described, containing an intelligent semiconductor switching element which can switch itself on and off means that the configuration complexity of the circuitry is less than that of the prior art although, nevertheless, it allows considerably greater flexibility to be achieved in the use of the semiconductor switching element for widely differing circuit variants, without at the same time having to accept the disadvantages of semiconductor circuits according to the prior art.

The present semiconductor circuit according to the invention is configured based upon the above description to explain as well as possible the principle of the invention and its practical use. The semiconductor circuit according to the invention can, of course, also be modified in many ways within the scope of specialist knowledge.

We claim:

1. A semiconductor circuit, comprising:
a drive circuit having a drive circuit output and producing a control signal at said drive circuit output;
a controllable, integrated semiconductor switching element configured to switch itself on and off;
a load-break switch for clocked switching of a load, said load-break switch having:
first and second load path connections;
a control connection connected to said drive circuit output; and
said control signal controlling said load-break switch through said control connection;
a first current source having a first output and providing a starting charging current at said first output when said load-break switch is switched off, said first current source connected to said first load path connection;
a monitoring device having at least one second current source with a second output;
said at least one second current source producing a status signal at said second output;
said monitoring device at least one of:
measuring a voltage between said first and second load path connections; and
measuring a potential present at one of said first and second load path connections;
said monitoring device producing said status signal dependent upon at least one of said voltage and said potential; and
a starting charging device connected to said drive circuit and supplying said drive circuit with power through said starting charging current.

2. The semiconductor circuit according to claim 1, wherein said starting charging device includes:
said first current source; and
an energy storage capacitor charged by said starting charging current and, in a charged state of said capacitor, said capacitor supplying said drive circuit with a supply potential.

3. The semiconductor circuit according to claim 2, including:
a decoupling diode disposed in series between said first current source and said energy storage capacitor; and
a voltage limiter disposed in parallel with said energy storage capacitor.

4. The semiconductor circuit according to claim 1, wherein said first current source is a controllable current source.

5. The semiconductor circuit according to claim 4, wherein said controllable current source is a controllable semiconductor switch.

6. The semiconductor circuit according to claim 1, wherein:
said starting charging device has a switching-off device for switching off said starting charging device;
said first current source has a control connection;
said switching-off device has:
an input connected to a floating potential; and
an output connected to said control connection of said first current source; and
said switching-off device always switches said starting charging device to a switched-off state whenever a potential at said input corresponds to at least one of:
a potential at said first output; and
a potential at said second load path connection.

7. The semiconductor circuit according to claim 1, wherein:
said starting charging device has a switching-off device for switching off said starting charging device;
said first current source has a control connection;
said switching-off device has:
an input connected to a floating potential; and
an output connected to said control connection of said first current source; and
said switching-off device switches said starting charging device to a switched-off state whenever a potential at said input corresponds to at least one of:
a potential at said first output; and
a potential at said second load path connection.

8. The semiconductor circuit according to claim 6, including at least one of a controllable switch and a limiter circuit disposed between said first output and said input of said switching-off device.

9. The semiconductor circuit according to claim 6, including at least one of a group consisting of a zener diode, a limiter switch, and an integrated circuit disposed between said first output and said input of said switching-off device, at least one of said group having at least one of:
a rising reverse current as temperatures rises; and
a reducing internal resistance as temperatures rises.

10. The semiconductor circuit according to claim 1, wherein:
said starting charging device has:
a detector device; and
a further output;
said detector device produces a status signal at said further output at a zero crossing of at least one of:
a voltage dropped across said load-break switch; and
a potential present at one of said first and second load path connections; and
said status signal switches said load-break switch to a switched-on state at each zero crossing.

11. The semiconductor circuit according to claim 1, wherein said monitoring device has an overvoltage switch-on facility identifying when overvoltages are present across said load-break switch and switching on said load-break switch when an overvoltage occurs.

12. The semiconductor circuit according to claim 11, including an AND gate connected upstream of said control connection of said load-break switch with respect to a control signal flow direction, said monitoring device producing a switch-on signal in response to switching on in an event of an overvoltage, said switch-on signal being fed to said AND gate, and said AND gate switching on said load-break switch.

13. The semiconductor circuit according to claim 1, wherein said monitoring device has an undervoltage switch-off facility identifying undervoltages present across said load-break switch and, in an event of an undervoltage, one of switching off said load-break switch and not switching said load-break switch on.

14. The semiconductor circuit according to claim 13, wherein:
said monitoring device has a hold circuit when switching off occurs in response to an undervoltage;
said hold circuit has an inverter disposed between said second output and said control connection of said load-break switch; and an AND gate is connected downstream from said inverter and switches off said load-break switch for as long as the undervoltage is present.

15. The semiconductor circuit according to claim 1, including a clocked drive signal controlling said semiconductor switching element.

16. The semiconductor circuit according to claim 1, wherein said load-break switch is a power semiconductor component.

17. The semiconductor circuit according to claim 16, wherein said load-break switch is a power semiconductor component based on the compensation principle.

18. The semiconductor circuit according to claim 1, wherein said load-break switch is one of the group consisting of a power MOSFET and an IGBT.

19. The semiconductor circuit according to claim 1, wherein:
said semiconductor switching element is in cell form and includes a plurality of cells having load paths;
said load paths of a majority of said cells are connected in parallel and form said load-break switch;
at least one of said starting charging device and said monitoring device has transistors; and
a remainder of said cells form said transistors.

20. The semiconductor circuit according to claim 16, wherein said semiconductor switching element has a current measurement device having at least one cell of said power semiconductor component and measures a load current through said load-break switch in accordance with a ratio of measurement cells to main cells.

21. The semiconductor circuit according to claim 1, wherein:
said drive circuit has:
an oscillator having an output side;
a logic circuit having an output side; and
a driver circuit having driver circuit inputs;
a supply potential is supplied to each of said oscillator, said logic circuit, and said driver circuit;
said output side of said oscillator and said output side of said logic circuit are connected to a respective one of said driver circuit inputs;
said driver circuit is connected to said control connection of said load-break switch; and
said driver circuit is driven based upon at least one of the group consisting of:
a control signal;
an oscillator signal; and
a signal derived from said load current.

22. A switch-mode power supply, comprising:
a load;
a semiconductor circuit having:
a drive circuit having a control signal input and a drive circuit output and producing a control signal at said drive circuit output;
a controllable, integrated semiconductor switching element configured to switch itself on and off;
a load-break switch for clocked switching of said load, said load-break switch having:
first and second load path connections;
a control connection connected to said drive circuit output; and
said control signal controlling said load-break switch through said control connection;
a first current source having a first output and providing a starting charging current at said first output when said load-break switch is switched off, said first current source connected to said first load path connection;
a monitoring device having at least one second current source with a second output;
said at least one second current source producing a status signal at said second output;
said monitoring device at least one of:
measuring a voltage between said first and second load path connections; and
measuring a potential present at one of said first and second load path connections;
said monitoring device producing said status signal dependent upon at least one of said voltage and said potential; and
a starting charging device connected to said drive circuit and supplying said drive circuit with power through said starting charging current;
a transformer having:
a primary winding; and
a secondary winding with a secondary output;
said semiconductor switching element configured to apply a substantially rectified voltage in a clocked manner to said primary winding;
said secondary winding supplying power from said primary winding at said secondary output to said load;
a feedback device connected to said control signal input; and
said feedback device supplying one of a voltage produced at said secondary output and a current at said secondary output to said control signal input.

23. The switch-mode power supply according to claim 22, wherein said drive circuit and parts of said starting charging device not contained in said semiconductor switching element are integrated together on a single semiconductor chip.

24. The switch-mode power supply according to claim 22, wherein:
said semiconductor switching element is integrated on a first semiconductor chip;
said drive circuit is integrated on a second semiconductor chip; and
said first and second semiconductor chips are embedded together in a single housing for a semiconductor component.

25. The switch-mode power supply according to claim 22, wherein the switch-mode power supply is a flyback converter.

26. The switch-mode power supply according to claim 22, wherein the switch-mode power supply is a forward converter.

27. The switch-mode power supply according to claim 22, wherein the switch-mode power supply is a quasi-resonant switch-mode power supply.

* * * * *